United States Patent
Mojumder et al.

(10) Patent No.: US 9,379,014 B1
(45) Date of Patent: Jun. 28, 2016

(54) STATIC RANDOM-ACCESS MEMORY (SRAM) ARRAY

(71) Applicant: QUALCOMM Incorporated, San Diego, CA (US)

(72) Inventors: Niladri Narayan Mojumder, San Diego, CA (US); Stanley Seungchul Song, San Diego, CA (US); Choh Fei Yeap, San Diego, CA (US); Mosaddiq Saifuddin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/803,063

(22) Filed: Jul. 18, 2015

(51) Int. Cl.
| | | |
|---|---|---|
| *H01L 23/52* | (2006.01) | |
| *H01L 21/768* | (2006.01) | |
| *H01L 23/522* | (2006.01) | |
| *H01L 23/528* | (2006.01) | |
| *H01L 27/11* | (2006.01) | |

(52) U.S. Cl.
CPC ........ *H01L 21/76897* (2013.01); *H01L 23/528* (2013.01); *H01L 23/5226* (2013.01); *H01L 27/1116* (2013.01)

(58) Field of Classification Search
CPC ...................... H01L 21/76897; H01L 23/5226; H01L 23/528; H01L 27/1116
USPC .......................................................... 257/774
See application file for complete search history.

(56) References Cited

U.S. PATENT DOCUMENTS

| | | | |
|---|---|---|---|
| 7,471,545 B2 * | 12/2008 | Nii ........................... | G11C 5/14 257/E21.661 |
| 8,488,371 B2 | 7/2013 | Uemura | |
| 8,823,178 B2 | 9/2014 | Kim et al. | |
| 8,830,732 B2 * | 9/2014 | Liaw ..................... | G11C 11/412 365/154 |
| 8,947,902 B2 * | 2/2015 | Liaw ..................... | G11C 11/412 365/63 |
| 2013/0094035 A1 | 4/2013 | Chang et al. | |
| 2014/0210100 A1 | 7/2014 | Xiao et al. | |
| 2014/0299941 A1 | 10/2014 | Paul | |

* cited by examiner

*Primary Examiner* — Luan C Thai
(74) *Attorney, Agent, or Firm* — Toler Law Group

(57) ABSTRACT

A static random-access memory (SRAM) array includes a first metal layer and a second metal layer. The metal layer includes multiple first source lines spanning multiple columns of cells. The multiple first source lines include a first source line and a second source line. The second metal layer includes multiple second source lines spanning multiple rows of cells. The SRAM array further includes a set of vias coupled to the multiple first source lines and to the multiple second source lines. A first via of the set of vias is coupled to the first source line and multiple vias of the set of vias are coupled to the second source line. Two vias of the multiple vias that are closest to the first via are each substantially the same distance from the first via.

20 Claims, 7 Drawing Sheets

STATIC RANDOM-ACCESS MEMORY (SRAM) ARRAY

I. FIELD

The present disclosure is generally related to a static random-access memory (SRAM) array.

II. DESCRIPTION OF RELATED ART

Electronic devices, such as wireless telephones, may include memories that include a memory array made of one or more memory cells. One type of memory array is a static random-access memory (SRAM) that includes one or more SRAM cells. A conventional SRAM cell may include multiple transistors, such as a 6 transistor SRAM cell or a 10 transistor SRAM cell. The conventional SRAM cell at a 10 nanometer (nm) scale may include M1-metal lines coupled to M2-metal lines using V1-vias. The V1-vias are formed using a lithography process that applies four or more different color masks to form the V1-vias. To scale SRAM cells smaller than 10 nm, forming the V1-vias using the four or more color masks may increase a production cost of an array of SRAM cells and limit variability (e.g. a design and/or a manufacturing tolerance) of the array of SRAM cells.

III. SUMMARY

In a particular aspect, a static random-access memory (SRAM) array includes a first metal layer and a second metal layer. The metal layer includes multiple first source lines spanning multiple columns of cells. The multiple first source lines include a first source line and a second source line. The second metal layer includes multiple second source lines spanning multiple rows of cells. The SRAM array further includes a set of vias configured coupled to the multiple first source lines and to the multiple second source lines. A first via of the set of vias is coupled to the first source line and multiple vias of the set of vias are coupled to the second source line. Two vias of the multiple vias that are closest to the first via are each substantially the same distance from the first via.

In another particular aspect, a method of forming a static random-access memory (SRAM) array includes forming multiple first source lines of a first metal layer of a static random-access memory (SRAM) array. Each of the multiple first source lines spanning multiple columns cells associated with the SRAM array. The method further includes forming a set of vias coupled to the multiple first source lines. A first via of the set of vias is coupled to a first source line of the multiple first lines and multiple vias of the set of vias are coupled to a second source line of the multiple first source lines. Two vias of the multiple vias that are closest to the first via are each substantially the same distance from the first via.

In another particular aspect, an apparatus includes first means for coupling a first source line of a first metal layer of a static random-access (SRAM) array to a second source line of a second metal layer of the SRAM array. The first metal layer includes multiple lines spanning multiple columns of cells and the second metal layer includes multiple lines spanning multiple rows of cells. The apparatus further includes second means for coupling the first source line to a third source line of the second metal layer. The apparatus also includes third means for coupling a fourth source line of the first metal layer to a fifth source line of the second metal layer. The fifth source line is positioned between the second source line and the third source line. The first means for coupling and the second means for coupling are substantially the same distance from the third means for coupling.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular aspects of the present disclosure are described below with reference to the drawings. In the description, common features are designated by common reference numbers. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

The present disclosure describes formation and structures of a memory array, such as a static random-access memory (SRAM) array. The SRAM array may include V1-vias that are formed using a lithography process that applies fewer than four color masks. For example, the V1-vias may be formed using three masks. In some implementations, the V1-vias may include a set of vias that is coupled to a first set of source lines (e.g., multiple ground lines) of a first metal (M1) layer and to a second set of source lines (e.g., multiple ground lines) of a second metal (M2) layer. In some implementations, each via of the set of vias may be formed using the same mask. By using less than four color masks, a mask count used to form the V1-vias may be reduced as compared to a number of masks to form a conventional SRAM array at a 10 nm scale.

Figure 1A:
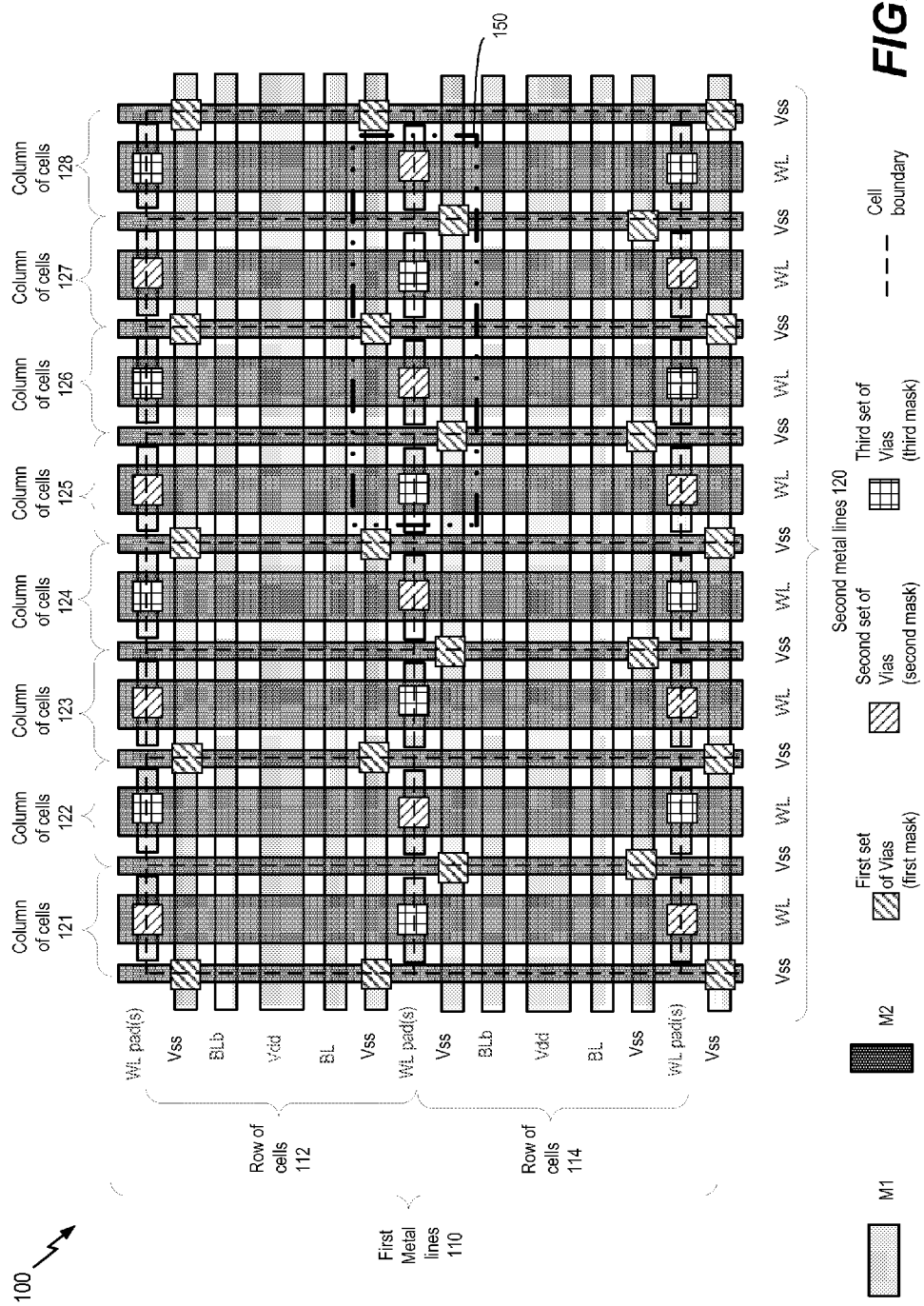
FIGS. 1A and 1B illustrate a first layout diagram of a first illustrative aspect of a static random-access memory (SRAM) array.

Referring to FIG. 1A, a first layout diagram of a first illustrative aspect of a static random-access memory (SRAM) array 100 is depicted. FIG. 1A depicts a portion of the SRAM array 100 that includes a first metal (M1) layer, a second metal (M2) layer, a via (V1) layer. The via (V1) layer may be positioned between the first metal (M1) layer and the second metal (M2) layer. As an illustrative non-limiting example, the SRAM array 100 may include multiple cells, such as multiple cells that may be used in an L1 and/or L2 cache of a processor. The multiple cells of the SRAM array 100 may be arranged in a grid-like fashion, including one or more rows of cells and one or more columns of cells.

The SRAM array 100 includes a first metal (M1) layer and a second metal (M2) layer. The first metal (M1) layer may include first metal lines 110 and the second metal (M2) layer includes second metal lines 120. Each of the first metal lines 110 may span multiple columns of cells of the SRAM array 100. For example, the multiple columns of cells may include a first column of cells 121, a second column of cells 122, a third column of cells 123, a fourth column of cells 124, a fifth column of cells 125, a sixth column of cells 126, a seventh column of cells 127, and an eighth column of cells 128. Although the SRAM array 100 is illustrated as including eight columns of cells, in other implementations, the SRAM array 100 may include more than or fewer than eight columns of cells. Each of the second metal lines 120 may span multiple rows of cells. For example, the multiple rows of cells may include a first row of cells 112 and a second row of cells 114. The first row of cells 112 may be adjacent to the second row of cells 114. Although the SRAM array 100 is illustrated as including two rows of cells, in other implementations, the SRAM array 100 may include more than or fewer than two rows of cells.

The first metal lines 110 may include wordline (WL) pads, first source lines (e.g., first Vss lines), first bit lines (BL), power lines (e.g., Vdd lines), and second bit lines (BLb). Each WL pad may correspond to a different SRAM cell of the SRAM array 100. The second metal (M2) layer may include multiple second lines, such as second source lines (e.g., second Vss lines) and wordlines (WLs). In some implementations, the first metal lines 110 may have a different arrangement than depicted in FIG. 1A. For example, the first source lines and the power lines of the first metal lines 110 may be switched such that a particular row of wordline (WL) pads is positioned between (and next to) two power lines, and a particular first source line is positioned between (and next to a first bit line (BL) and a second bit line (BLb). A particular second source line may be positioned between two adjacent wordlines (WLs) to reduce wordline-to-wordline coupling and maintain wordline signal integrity of the SRAM array 100.

In some implementations, the first source lines and the second source lines may be ground lines. In other implementations, the second source lines may be power lines (e.g., Vdd lines) that are coupled to the power lines included in the first metal lines 110. Each of the first metal lines 110 and the second metal lines 120 may be arranged in a linear pattern that is compatible with a self-aligned double patterning (SADP) process. The first metal lines 110 of the first metal (M1) layer may be orthogonal to the second metal lines 120 of the second metal (M2) layer.

The via (V1) layer may include a plurality of vias. The plurality of vias may have been formed using multiple color masks, such as three or fewer masks, of a lithography process. For example, a first set of vias of the plurality of vias may be associated with a first mask, a second set of vias of the plurality of vias may be associated with a second mask, and a third set of vias of the plurality of vias may be associated with a third mask. The first set of vias may be coupled the first source lines (of the first metal layer) and to the second source lines (of the second metal layer). For example, the first set of vias may "strap" the first source lines and the second source lines to form a source line mesh (e.g., a grid of ground lines). The source line mesh may have a voltage drop (i.e., an IR drop) within a threshold range such that performance of one or more bit cells of the SRAM array 100 are not degraded. For a particular first source line of the first metal (M1) layer, each pair of adjacent vias coupled to the particular first source line may be separated by two columns of cells. The second set of vias may couple a first set of wordline pads (of the first metal layer) to the wordlines (of the second metal layer). The third set of vias may couple a second set of wordline pads (of the first metal layer) to the wordlines (of the second metal layer).

As an illustrative, non-limiting example, a first design layout margin may include a minimum spacing of greater than 40 nanometers (nm) between vias formed using the same mask. Additionally or alternatively, a second design layout margin may include a minimum spacing of greater than 100 nanometers (nm) between two vias formed using different masks, as an illustrative, non-limiting example. In some implementations, a distance between two vias may be measured between a first geometric center of a first via and a second geometric cent of a second via.

Figure 1B:
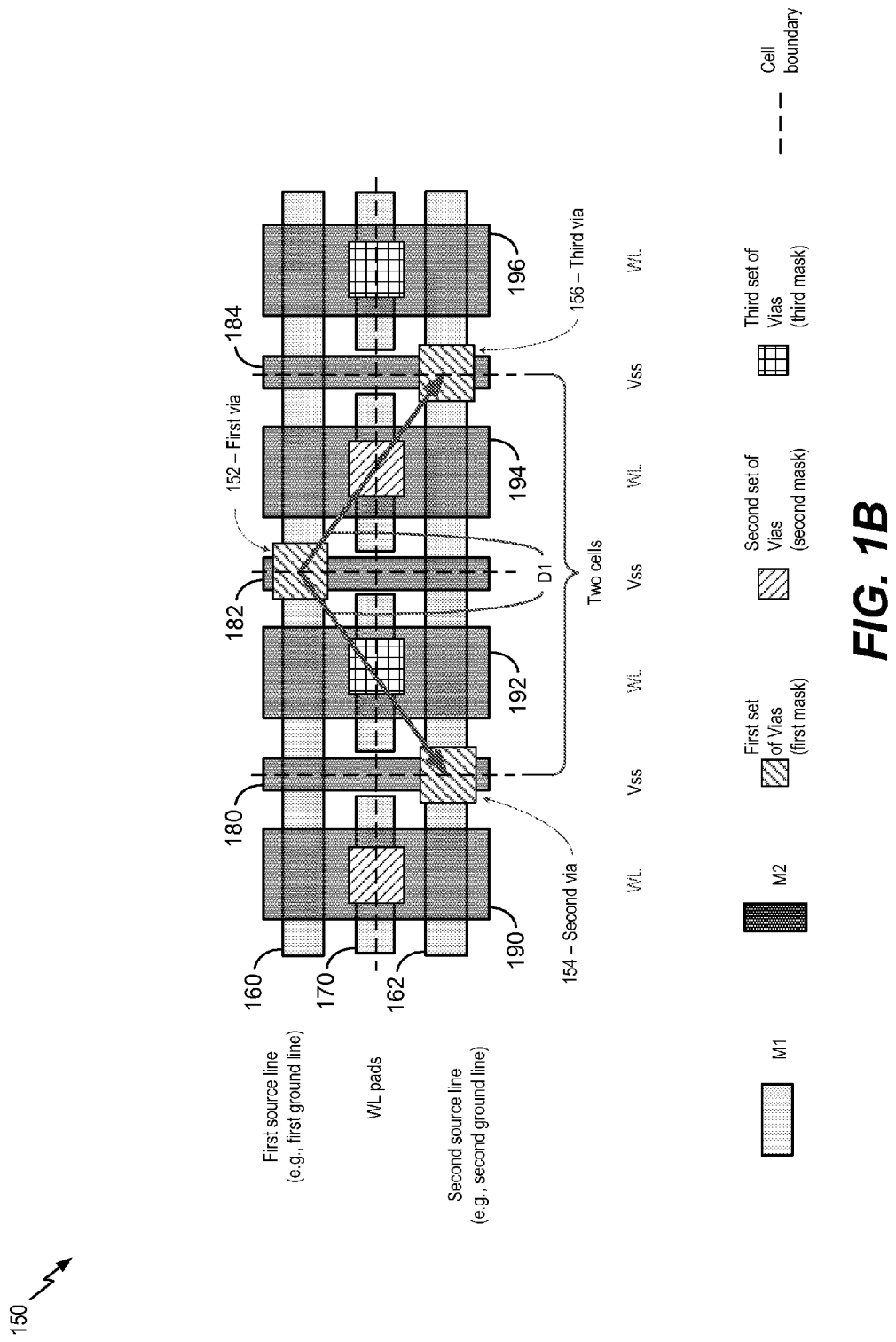

Referring to FIG. 1B, a detailed view of a portion 150 of the SRAM array 100 is depicted. The first metal (M1) layer of the portion 150 may include a first source line 160 (e.g., a first ground line) and a second source line 162 (e.g., a second ground line). The first metal (M1) layer may also include a row of wordline pads that is positioned between first source line 160 and the second source line 162. The row of wordline pads may include multiple wordline pads, such as a representative wordline pad 170.

The second metal (M2) layer of the portion 150 may include a third source line 180, a fourth source line 182, a fifth source line 184. The second metal (M2) layer of the portion may also include a first wordline 190, a second wordline 192, a third wordline 194, and a fourth wordline 196. The second metal (M2) layer may include alternating source lines and wordlines. For example, the third source line 180 may be positioned between the first wordline 190 and the second wordline 192, the second wordline 192 may be positioned between the third source line 180 and the fourth source line 182, etc.

The portion 150 includes a first via 152, a second via 154, and a third via 156 formed using the same color mask, such as a first color mask. A second set of vias may be formed using a second color mask, and a third set of vias may be formed using a third color mask. Each via of the second set of vias may couple a corresponding wordline pad (of the first metal (M1) layer) to a corresponding wordline (of the second metal (M2) layer). Each via of the third set of vias may couple a corresponding wordline pad (of the first metal (M1) layer) to a corresponding wordline (of the second metal (M2) layer).

The first via 152 may couple the first source line 160 of the first metal layer to the fourth source line 182 of the second metal (M2) layer. Each of the second via 154 and the third via 156 may couple the second source line 162 of the first metal layer to a corresponding source line of the second metal (M2) layer. For example, the second via 154 may be coupled to the second source line 162 and to the third source line 180. As another example, the third via 156 may be coupled to the second source line 162 and to the fifth source line 184.

With reference to the first via 152, the second via 154 and the third via 156 may be the closest two vias that are coupled to the second source line 162 of the first metal layer. For example, the first via 152 may be a distance (D1) from each of the second via 154 and the third via 156. As used here, two distances may be substantially the same distance according to design tolerances and/or manufacturing tolerances. A distance between two vias may be measured as a distance between geometric centers of the two vias or between the proximate edges of the two vias.

By using less than four color masks, a mask count used to form the V1-vias may be reduced as compared to a number of masks to form a conventional SRAM array at a 10 nm scale. Additionally, the layout of the first set of vias that couple the first source lines to the second source lines may result in source line strapping that has a low enough IR drop for performance of the SRAM array 100. Additionally, the layout of the SRAM array 100 may be free of non-linear patterns which means the SRAM array is compatible with SADP semiconductor manufacturing processes at less than 10 nm (e.g., 7 nm).

Figure 2A:
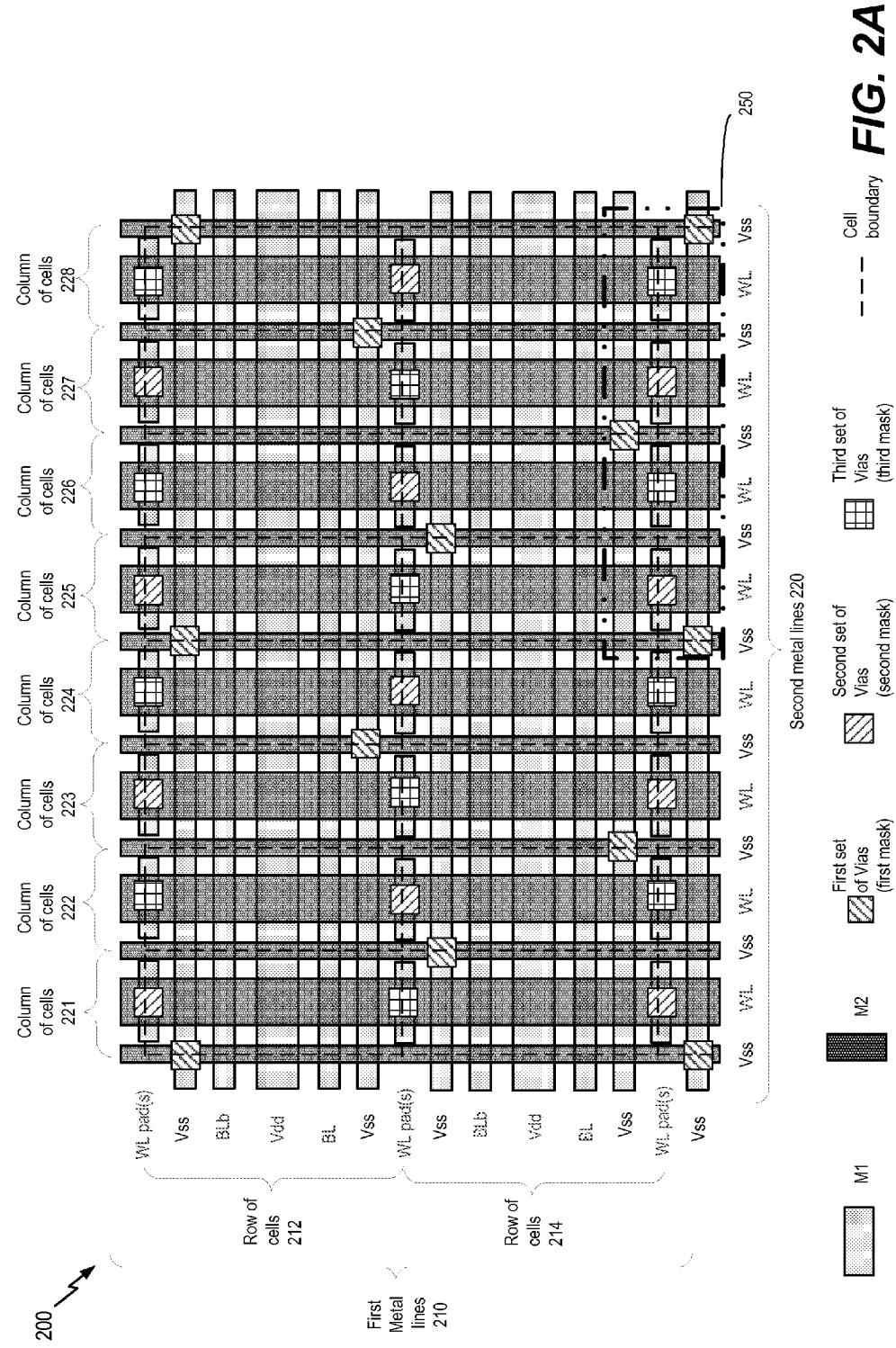
FIGS. 2A and 2B illustrate a second layout diagram of a second illustrative aspect of an SRAM array

Referring to FIG. 2A, a second layout diagram of a second illustrative aspect of a static random-access memory (SRAM) array 200 is depicted. FIG. 2A depicts a portion of the SRAM array 200 that includes a first metal (M1) layer, a second metal (M2) layer, a via (V1) layer. The via (V1) layer may be positioned between the first metal (M1) layer and the second metal (M2) layer. As an illustrative non-limiting example, the SRAM array 200 may include multiple cells, such as multiple cells that may be used in an L1 and/or L2 cache of a processor. The multiple cells of the SRAM array 200 may be arranged in a grid-like fashion, including one or more rows of cells and one or more columns of cells.

The SRAM array 200 includes a first metal (M1) layer and a second metal (M2) layer. The first metal (M1) layer may include first metal lines 210 and the second metal (M2) layer may include second metal lines 220. Each of the first metal lines 210 may span multiple columns of cells of the SRAM array 200. For example, the multiple columns of cells may include a first column of cells 221, a second column of cells 222, a third column of cells 223, a fourth column of cells 224, a fifth column of cells 225, a sixth column of cells 226, a seventh column of cells 227, and an eighth column of cells 228. Although the SRAM array 200 is illustrated as including eight columns of cells, in other implementations, the SRAM array 200 may include more than or fewer than eight columns of cells. Each of the second metal lines 220 may span multiple rows of cells. For example, the multiple rows of cells may include a first row of cells 212 and a second row of cells 214. The first row of cells 212 may be adjacent to the second row of cells 214. Although the SRAM array 200 is illustrated as including two rows of cells, in other implementations, the SRAM array 200 may include more than or fewer than two rows of cells.

The first metal lines 210 and the second metal lines 220 may include or correspond to the first metal lines 110 and the second metal lines 120, respectively, of FIG. 1A. Each of the first metal lines 210 and the second metal lines 220 may be arranged in a linear pattern that is compatible with a self-aligned double patterning (SADP) process. The first metal lines 210 of the first metal (M1) layer may be orthogonal to the second metal lines 220 of the second metal (M2) layer.

The via (V1) layer may include a plurality of vias. The plurality of vias may have been formed using multiple color masks, such as three or fewer masks, of a lithography process. For example, a first set of vias of the plurality of vias may be associated with a first mask, a second set of vias of the plurality of vias may be associated with a second mask, and a third set of vias of the plurality of vias may be associated with a third mask. The first set of vias may be couple the first source lines (of the first metal layer) to the second source lines (of the second metal layer). For a particular first source line of the first metal (M1) layer, each pair of adjacent vias coupled to the particular first source line may be separated by four columns of cells. The second set of vias may couple a first set of wordline pads (of the first metal layer) to the wordlines (of the second metal layer). The third set of vias may couple a second set of wordline pads (of the first metal layer) to the wordlines (of the second metal layer).

Figure 2B:
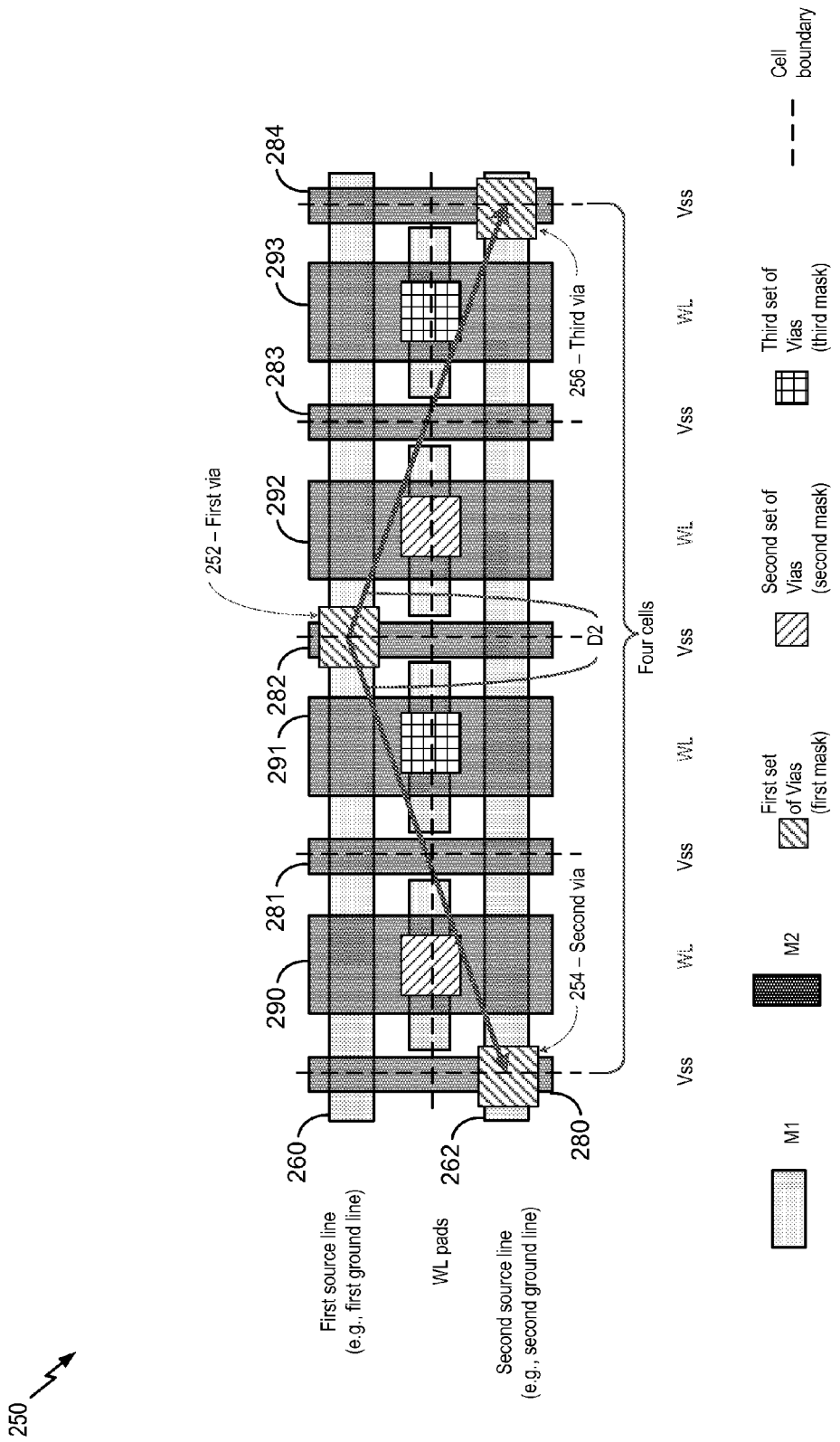

Referring to FIG. 2B, a detailed view of a portion 250 of the SRAM array 200 is depicted. The first metal (M1) layer of the portion 250 may include a first source line 260 (e.g., a first ground line) and a second source line 262 (e.g., a second ground line). The first metal (M1) layer may also include a row of wordline pads that is positioned between first source line 260 and the second source line 262.

The second metal (M2) layer of the portion 250 may include a third source line 280, a fourth source line 281, a fifth source line 282, a sixth source line 283, and a seventh source line 284. The second metal (M2) layer of the portion may also include a first wordline 290, a second wordline 291, a third wordline 292, and a fourth wordline 293. The second metal (M2) layer may include alternating source lines and wordlines. For example, the fourth source line 281 may be positioned between the first wordline 290 and the second wordline 291, the second wordline 291 may be positioned between the fourth source line 281 and the fifth source line 282, etc.

The portion 250 includes a first via 252, a second via 254, and a third via 256 formed using the same color mask, such as a first color mask. A second set of vias may be formed using a second color mask, and a third set of vias may be formed using a third color mask. Each via of the second set of vias may couple a corresponding wordline pad (of the first metal (M1) layer) to a corresponding wordline (of the second metal (M2) layer). Each via of the third set of vias may couple a corresponding wordline pad (of the first metal (M1) layer) to a corresponding wordline (of the second metal (M2) layer).

The first via 252 may couple the first source line 260 of the first metal layer to the fifth source line 282 of the second metal (M2) layer. Each of the second via 254 and the third via 256 may couple the second source line 162 of the first metal layer to a corresponding source line of the second metal (M2) layer. For example, the second via 254 may be coupled to the second source line 262 and to the third source line 280. As another example, the third via 256 may be coupled to the second source line 262 and to the seventh source line 284.

With reference to the first via 252, the second via 254 and the third via 256 may be the closest two vias that are coupled to the second source line 262 of the first metal layer. For example, the first via 252 may be a distance (D2) from each of the second via 254 and the third via 256.

When manufactured, each cell of the SRAM array 100 of FIG. 1A and/or each cell of the SRAM array 200 of FIG. 2 may include various components/layers. For example, the various components/layers may include fins (FinFETs including source/drain regions), transistor gates (alternately referred to as poly lines), middle-of-line contacts (e.g., local interconnects) for transistor source/drain regions (MD), middle-of-line contacts (e.g., local interconnects) for gates/poly lines (MP), a first metal (M1) layer, vias connecting MD and MP to M1 (Via0), a second metal (M2) layer, and vias connecting M1 to M2 (Via1), as illustrative, non-limiting examples.

Adjacent vias coupled to the same first source line of the first metal (M1) layer of the SRAM array 100 of FIG. 1A may be separated by at least two columns of cells of the SRAM array 100. Adjacent vias coupled to the same first source line of the first metal (M1) layer of the SRAM array 200 of FIG. 2A may be separated by at least four columns of cells of the SRAM array 200. Each of the SRAM array 100 of FIG. 1A and the SRAM array 200 of FIG. 2A may be compatible with SADP metal patterning for manufacturing processes less than 10 nm (e.g., 7 nm). In addition, by coupling each first source line of the first metal (M1) layer to multiple second source lines of the second metal (M2) layer, the SRAM array 100 of FIG. 1A and/or the SRAM array 200 of FIG. 2A may have a source line IR drop (which may be related to a source line resistance) that is lower than or equal to conventional SRAM array designs. Further, SRAM array 100 of FIG. 1A and/or the SRAM array 200 of FIG. 2A may be compatible with a three-mask lithography process (e.g., an optical lithography process) for via formation, which may reduce manufacturing cost as compared to a four-mask lithography process for via formation.

Figure 3:
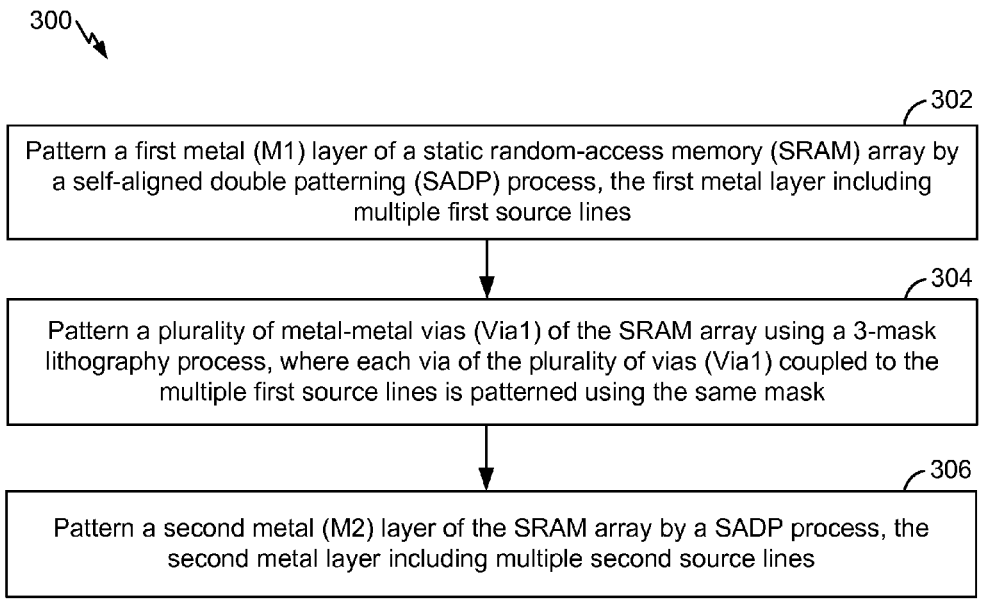
FIG. 3 is a flow chart of a particular illustrative aspect of a method of forming an SRAM array.

Referring to FIG. 3, a flowchart of a particular illustrative embodiment of a method 300 of forming a memory array is shown and generally designated 300. In some implementations, the memory array may include a static random-access memory (SRAM) array. For example, all or a portion of the method 300 may be performed during manufacturing of the SRAM array 100 or the SRAM array 200.

The method 300 may include patterning a first metal (M1) layer of a static random-access memory (SRAM) array by a self-aligned double patterning (SADP) process, at 302. The first metal (M1) layer may include multiple first source lines. For example, the first metal (M1) layer may include or correspond to the first metal lines 110 of FIG. 1A or the first metal lines 210 of FIG. 2A.

The method 300 may further include patterning a plurality of vias (Via1) of the SRAM array using a 3-mask lithography process, at 304. Each via of the plurality of vias (Via1) coupled to the multiple first sources lines is patterned using the same mask.

The method 300 may also include patterning a second metal (M2) layer of the SRAM array by a SADP process, at 306. The second metal (M2) layer may include multiple second source lines. For example, the second metal (M2) layer may include or correspond to the second metal lines 120 of FIG. 1A or the second metal lines 220 of FIG. 2A. In some implementations, the first metal (M1) layer and the second metal (M2) layer may each be free of non-linear patterns and may thus be compatible with SADP.

In some implementations, prior to patterning the first metal (M1) layer, the plurality of vias (Via1) (e.g., metal-to-metal vias), and the second metal (M2) layer, the method 300 may include patterning fins (source/drain regions) and poly lines (gates) of the SRAM array. Additionally or alternatively, prior to patterning the first metal (M1) layer, the plurality of vias (Via1), and the second metal (M2) layer. The method 300 may also include patterning middle-of-line contacts (e.g., local interconnects) for source/drain (e.g., MD layer) and poly lines (e.g., MP layer) of the SRAM array.

Figure 4:
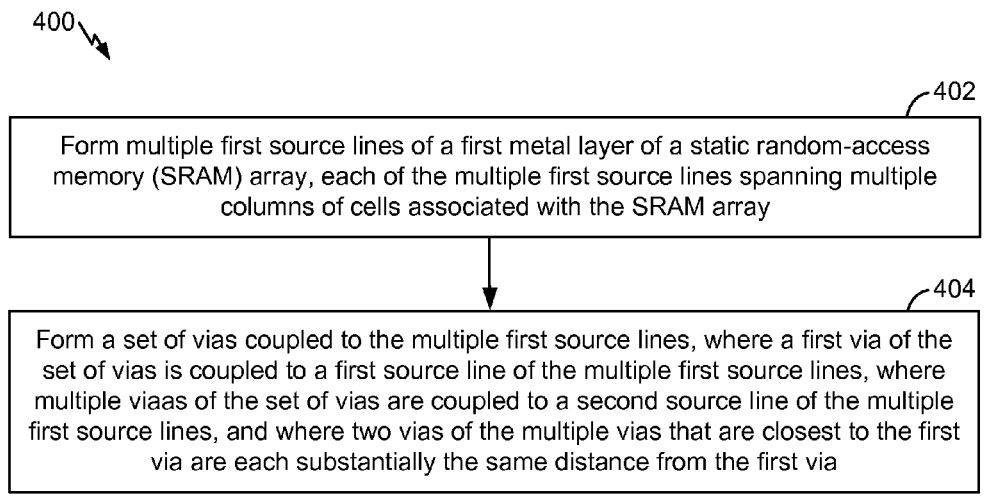
FIG. 4 is a flow chart of a particular illustrative aspect of another method of forming an SRAM array.

Referring to FIG. 4, a flow diagram of an illustrative aspect of a method 400 of forming an SRAM array is depicted. The SRAM array may include or correspond to the SRAM array 100 of FIG. 1A or the SRAM array 200 of FIG. 2A.

The method 400 may include forming multiple first source lines of a first metal layer of a static random-access memory (SRAM) array, at 402. Each of the multiple first source lines may span multiple columns of cells of the SRAM array. The first metal layer may include or correspond to the first metal lines 110 of FIG. 1A or the first metal lines 210 of FIG. 2A. In some implementations, each cell of the SRAM array may be coupled to two corresponding source lines (e.g., ground lines) of the multiple first source lines. Additionally or alternatively, the first metal layer may include multiple rows of wordline pads. The multiple rows of wordline pads may be parallel to the multiple first source lines. Forming the multiple first source lines may include patterning the first metal layer using a self-aligned double patterning (SADP) process.

The method 400 may further include forming a set of vias coupled to the multiple first source lines, at 404. A first via of the set of vias may be coupled to a first source line of the multiple first source lines, and multiple the vias of the set of vias may be coupled to a second source line of the multiple first source lines. Two vias of the multiple vias that are closest to the first via may each be substantially the same distance from the first via.

The two vias may include a second via coupled to the second source line at a first location and a third via coupled to the second source line at a second location. In some implementations, a portion of the second source line between the first location and the second location may span at least two cells of the SRAM array. For example, as depicted in FIG. 1A, adjacent vias coupled to the same first source line of the first metal (M1) layer of the SRAM array 100 may be separated by at least two columns of cells of the SRAM array 100. In other implementations, the portion may span four cells of the SRAM array. For example, as depicted in FIG. 2A, adjacent vias coupled to the same first source line of the first metal (M1) layer of the SRAM array 200 may be separated by at least four columns of cells of the SRAM array 200.

Forming the set of vias may include patterning a plurality of vias using a lithography process. The plurality of vias may include the set of vias. The lithography process may use less than four masks (e.g., less than four different color masks). In some implementations, each via of the plurality of vias (Via1) that is coupled to one of the multiple first sources lines may be patterned using the same mask. For example, as depicted in FIG. 1A, each via that couples a corresponding first source line of the first metal (M1) layer to a corresponding second source line of the second metal (M2) layer may be formed using the same color mask. For another example, as depicted in FIG. 2A, each via that couples a corresponding first source line of the first metal (M1) layer to a corresponding second source line of the second metal (M2) layer may be formed using the same color mask.

In some implementations, the method 400 may include forming multiple second source lines of a second metal layer of the SRAM array. The second metal (M2) layer may include or correspond to the second metal lines 120 of FIG. 1A or the second metal lines 220 of FIG. 2A. Each of the multiple second source lines may span multiple rows of cells associated with the SRAM array. In this implementation, the set of vias may be coupled to the multiple first source lines and to the multiple second source lines. Additionally or alternatively, the second metal layer may include multiple wordlines. The multiple wordlines may be parallel to the multiple second source lines. Forming the multiple second source lines may include patterning the second metal layer using a self-aligned double patterning (SADP) process.

The second metal layer may be positioned above the first metal layer and may be arranged according to a linear pattern. In some implementations, the multiple first source lines may be orthogonal to the multiple second source lines. Additionally or alternatively, each of the multiple first source lines and each of the multiple second source lines is a ground line. In some implementations, the first metal layer, the second metal layer, and the set of vias may be manufactured using a 10 nanometers (nm) process.

In some implementations, when the SRAM array includes the first metal layer and the second metal layer, the method 400 may include forming multiple wordline pads of the first metal layer and forming multiple wordlines of the second metal layer. Each of the multiple wordlines may span the multiple rows of cells. The set of vias may be formed using a first mask, a second set of vias may be formed using a second mask, and a third set of vias may be formed using a third mask. The second set of vias may be coupled to the multiple wordlines and to a first set of the multiple wordline pads. The third set of vias may be coupled to the multiple wordlines and to a second set of multiple wordline pads. In some implementations, the multiple wordlines may include a first wordline and a second wordline. A third source line of the multiple second source lines may be positioned between the first wordline and the second wordline.

The method 400 may be used to form an SRAM array that has a source line IR drop (e.g., a source line resistance) that is lower than or equal to conventional SRAM array designs. Additionally, the method 400 may be compatible with a three-mask lithography process (e.g., an optical lithography process) for via formation, which may reduce manufacturing cost as compared to a four-mask lithography process for via formation of conventional SRAM arrays formed using manufacturing processes of less than 14 nm.

It should be noted that the order of steps illustrated in FIGS. 3 and 4 are for illustrative purposes only, and is not to be considered limiting. In alternative implementations, certain steps may be performed in a different order and/or may be performed concurrently (or at least partially concurrently). The method 300 of FIG. 3 and/or the method 400 of FIG. 4 may be controlled by a processing unit such as a central processing unit (CPU), a controller, a field-programmable gate array (FPGA) device, an application-specific integrated circuit (ASIC), another hardware device, firmware device, or any combination thereof. As an example, the method 300 of FIG. 3 and/or the method 400 of FIG. 4 can be performed by one or more processors that execute instructions to control fabrication equipment.

Figure 5:
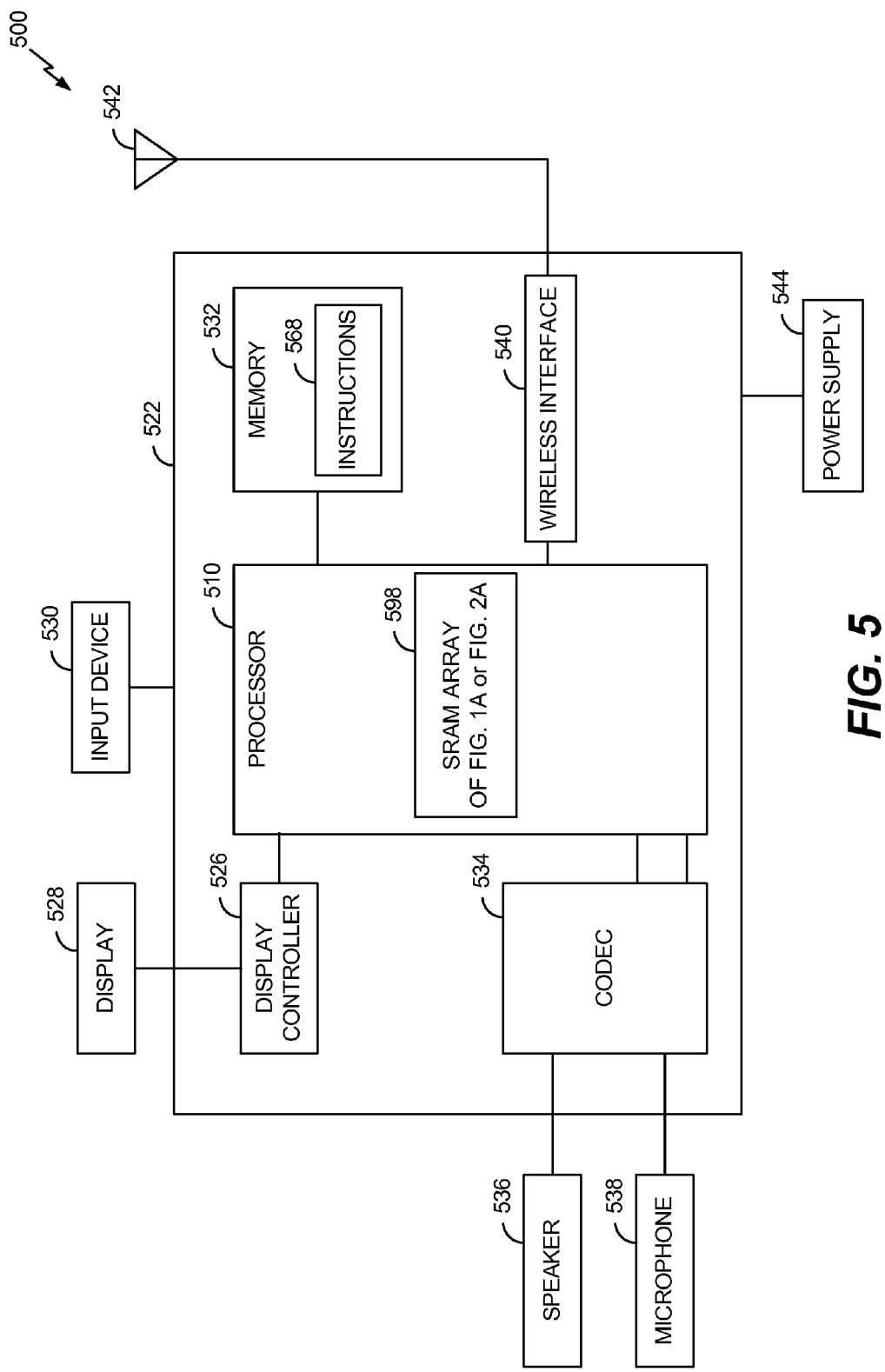
FIG. 5 is a block diagram of an electronic device including the SRAM array of FIG. 1A or the SRAM array of FIG. 2A.

Referring to FIG. 5, a block diagram of a particular illustrative aspect of a device 500, such as an electronic device, is depicted. In some implementations, the device 500 may be a wireless communication device. The device 500 includes a processor 510, such as a digital signal processor (DSP), coupled to a memory 532.

The memory 532 includes instructions 568 (e.g., executable instructions), such as computer-readable instructions or processor-readable instructions. The instructions 568 may include one or more instructions that are executable by a computer, such as the processor 510. The processor 510 includes an SRAM array 598, where the SRAM array 598 includes the SRAM array 100 and/or the SRAM array 200. For example, the SRAM array 598 may correspond to an L1 cache and/or an L2 cache memory. The SRAM array 598 may be manufactured according to all or a portion of the method 300 of FIG. 3 and/or the method 400 of FIG. 4. It should be noted that although FIG. 5 illustrates use of the SRAM array 598 in the processor 510 of the device 500, this is not to be considered limiting. For example, in some implementations, the SRAM array 598 may be external to and/or coupled to the processor 510.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534. FIG. 5 also indicates that a wireless interface 540 can be coupled to the processor 510 and to an antenna 542. In some implementations, the processor 510, the display controller 526, the memory 532, the CODEC 534, and the wireless interface 540 are included in a system-in-package or system-on-chip device 522, such as a mobile station modem (MSM). In some implementations, an input device 530 and a power supply 544 are coupled to the system-on-chip device 522. Moreover, in a particular aspect, as illustrated in FIG. 5, the display 528, the input device 530, the speaker 536, the microphone 538, the antenna 542, and the power supply 544 are external to the system-on-chip device 522. However, each of the display 528, the input device 550, the speaker 536, the microphone 538, the antenna 542, and the power supply 544 can be coupled to a component of the system-on-chip device 522, such as an interface or a controller. Although the SRAM array 598 is depicted as being included in the processor 510, in other implementations, the SRAM array 598 may be included in another component of the device 500 or a component coupled to the device 500. For example, the SRAM array 598 may be included in wireless interface 540, the memory 532, the power supply 544, the input device 530, the display 528, the display controller 526, the CODEC 534, the speaker 536, or the microphone 538.

In conjunction with one or more of the described aspects of FIGS. 1-5, an apparatus is disclosed that may include first means for coupling a first source line of a first metal layer of a static random-access (SRAM) array to a second source line of a second metal layer of the SRAM array. The first metal layer may include multiple lines spanning multiple columns of cells, and the second metal layer may include multiple lines spanning multiple rows of cells. The first means for coupling the first source line to the second source line may include the second via 154 of FIG. 1B, the second via 254 of FIG. 2B, one or more other structures that couple the first source line to the second source line, or any combination thereof. In some implementations, the first source line may correspond to a first row of cells of the SRAM array.

The apparatus may also include a second means for coupling the first source line to a third source line of the second metal layer. The second means for coupling the first source line to the third source line may include the third via 156 of FIG. 1B, the third via 256 of FIG. 2B, one or more other structures that couple the first source line to the third source line, or any combination. In some implementations, each of the first means for coupling and the second means for coupling are included in the same row of cells of the SRAM array.

The apparatus may also include third means for coupling a fourth source line of the first metal layer to a fifth source line of the second metal layer. The fifth source line may be positioned between the second source line and the third source line. The first means for coupling and the second means for coupling may be substantially the same distance from the third means for coupling. The third means for coupling the fourth source line to the fifth source line may include the first via 152 of FIG. 1B, the first via 252 of FIG. 2B, one or more other structures that couple the fourth source line to the fifth source line, or any combination. In some implementations, the fourth source line may correspond to a second row of cells of the SRAM array. The second row of cells may be adjacent to the first row of cells.

In some implementations, the first means for coupling and the second means for coupling are separated a distance greater than or equal to two cells of the SRAM array. Additionally or alternatively, the first means for coupling and the second means for coupling may be separated by a distance greater than or equal to four cells of the SRAM array.

One or more of the disclosed aspects may be implemented in a system or an apparatus, such as the device 500, that may include a communications device, a fixed location data unit, a mobile location data unit, a mobile phone, a cellular phone, a satellite phone, a computer, a tablet, a portable computer, a display device, a media player, or a desktop computer. Alternatively or additionally, the device 500 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a satellite, a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

Figure 6:
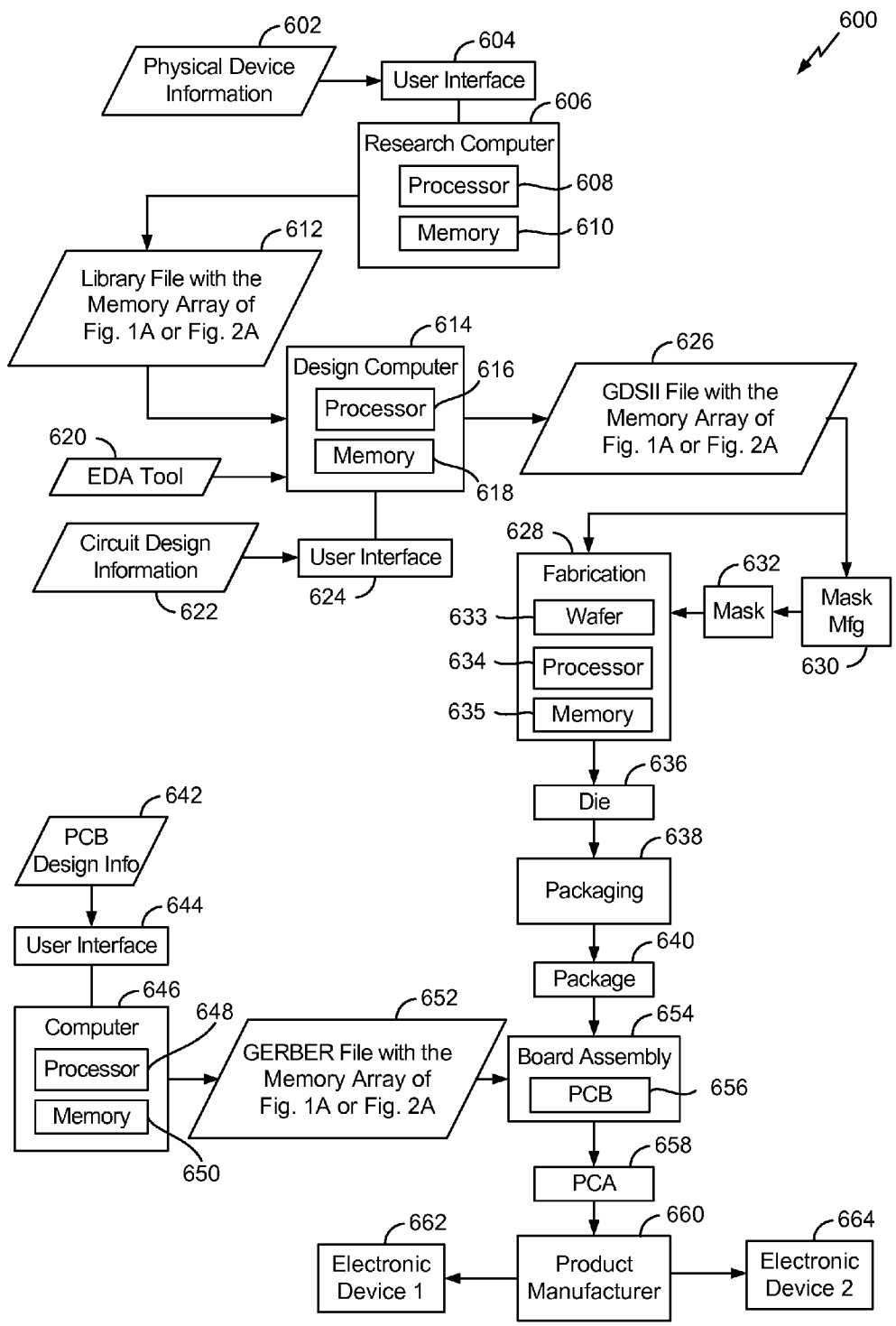
FIG. 6 is a data flow diagram of a particular illustrative aspect of a manufacturing process to manufacture electronic devices that include the SRAM array of FIG. 1A or the SRAM array of FIG. 2A.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative aspect of an electronic device manufacturing process 600.

Physical device information 602 is received at the manufacturing process 600, such as at a research computer 606. The physical device information 602 may include design information representing at least one physical property of the SRAM array 100, the SRAM array 200, an SRAM array formed according to the method 300 of FIG. 3 and/or the method 400 of FIG. 4, or a combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer-readable medium (e.g., a non-transitory computer-readable medium), such as a memory 610. The memory 610 may store computer-readable instructions that are executable to cause the processor 608 to transform the physical device information 602 to comply with a file format and to generate a library file 612.

In some implementations, the library file 612 includes at least one data file including the transformed design information. For example, the library file 612 may include a library of devices including a device that includes the SRAM array 100, the SRAM array 200, an SRAM array formed according to the method 300 of FIG. 3 and/or the method 400 of FIG. 4, or a combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the SRAM array 100, the SRAM array 200, an SRAM array formed according to the method 300 of FIG. 3 and/or the method 400 of FIG. 4, or a combination thereof. For example, a user of the design computer 614 may enter circuit design information 622 via a user interface 624 coupled to the design computer 614. The circuit design information 622 may include design information representing at least one physical property of the SRAM array 100 and/or the SRAM array 200. To illustrate, the circuit design property may include identification of particular circuits and relationships to other elements in a circuit design, positioning information, feature size information, interconnection information, or other information representing a physical property of the SRAM array 100 and/or the SRAM array 200.

The circuit design information 622 may include design information representing at least one physical property of a component of the SRAM array 100, the SRAM array 200, an SRAM array formed according to the method 300 of FIG. 3 and/or the method 400 of FIG. 4, or a combination thereof. To illustrate, the circuit design property may include identification of particular circuits and relationships to other elements in a circuit design, positioning information, feature size information, interconnection information, or other information representing a physical property of components of the SRAM array 100, the SRAM array 200, an SRAM array formed according to the method 300 of FIG. 3 and/or the method 400 of FIG. 4, or a combination thereof.

The design computer 614 may be configured to transform the design information, including the circuit design information 622, to comply with a file format. To illustrate, the file format may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the SRAM array 100, the SRAM array 200, an SRAM array formed according to the method 300 of FIG. 3 and/or the method 400 of FIG. 4, or a combination thereof, in addition to other circuits or information. To illustrate, the data file may include information corresponding to a system-on-chip (SOC) that includes the SRAM array 100, the SRAM array 200, an SRAM array formed according to the method 300 of FIG. 3 and/or the method 400 of FIG. 4, or a combination thereof, and that also includes additional electronic circuits and components within the SOC.

The GDSII file 626 may be received at a fabrication process 628 to manufacture the SRAM array 100, the SRAM array 200, an SRAM array formed according to the method 300 of FIG. 3 and/or the method 400 of FIG. 4, or a combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 633, which may be tested and separated into dies, such as a representative die 636. The die 636 includes a circuit including a device that includes the SRAM array 100, the SRAM array 200, an SRAM array formed according to the method 300 of FIG. 3 and/or the method 400 of FIG. 4, or a combination thereof.

For example, the fabrication process 628 may include a processor 634 and a memory 635 to initiate and/or control the fabrication process 628. The memory 635 may include executable instructions such as computer-readable instructions or processor-readable instructions. The executable instructions may include one or more instructions that are executable by a computer such as the processor 634.

The fabrication process 628 may be implemented by a fabrication system that is fully automated or partially automated. For example, the fabrication process 628 may be automated according to a schedule. The fabrication system may include fabrication equipment (e.g., processing tools) to perform one or more operations to form an SRAM array the SRAM array 100, the SRAM array 200, an SRAM array formed according to the method 300 of FIG. 3 and/or the method 400 of FIG. 4, or a combination thereof. For example, the fabrication equipment may be configured to deposit one or more materials using chemical vapor deposition (CVD) and/or physical vapor deposition (PVD), pattern materials using a single-mask or multi-mask litho-etch process, pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular embodiment, the fabrication process 628 corresponds to a semiconductor manufacturing process associated with a technology node smaller than 10 nm (e.g., 7 nm, etc.). The specific process or combination of processes used to manufacture a device (e.g., including the SRAM array 100 and/or the SRAM array 200) may be based on design constraints and available materials/equipment. Thus, in a particular implementation, different processes may be used than described with reference to FIGS. 1-6 during manufacture of the device.

As an illustrative example, a three-mask lithography process used during Via1 formation for the SRAM array 100 and/or the SRAM array 200 may include using a first photoresist mask to form a first pattern on a layer (e.g., a dielectric layer) of a device. The first pattern may correspond to a first set of vias configured to couple multiple first source lines of a first metal (M1) layer to multiple second source lines of a second metal (M2) layer. A second mask may then be used to form a second pattern on the device. The second pattern may correspond to a second set of vias configured to couple a first set of wordline pads of the first metal layer to wordlines of the second metal layer. A third mask may then be used to form a third pattern on the device. The third pattern may correspond to a third set of vias configured to couple a second set of wordline pads of the first metal layer to the wordlines of the second metal layer.

The fabrication system (e.g., an automated system that performs the fabrication process 628) may have a distributed architecture (e.g., a hierarchy). For example, the fabrication system may include one or more processors, such as the processor 634, one or more memories, such as the memory 635, and/or controllers that are distributed according to the distributed architecture. The distributed architecture may include a high-level processor that controls or initiates operations of one or more low-level systems. For example, a high-level portion of the fabrication process 628 may include one or more processors, such as the processor 634, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In some implementations, the fabrication system may include multiple processors that are distributed in the fabrication system. For example, a controller of a low-level system component may include a processor, such as the processor 634.

Alternatively, the processor 634 may be a part of a high-level system, subsystem, or component of the fabrication system. In another implementation, the processor 634 includes distributed processing at various levels and components of a fabrication system.

Thus, the processor 634 may include processor-executable instructions that, when executed by the processor 634, cause the processor 634 to initiate or control formation of an SRAM array, such as the SRAM array 100 of FIG. 1A or the SRAM array 200 of FIG. 2A. For example, the executable instructions included in the memory 635 may enable the processor 634 to initiate formation of the SRAM array 100, the SRAM array 200, an SRAM array formed according to the method 300 of FIG. 3 and/or the method 400 of FIG. 4, or a combination thereof. In some implementations, the memory 635 is a non-transient computer-readable medium storing computer-executable instructions that are executable by the processor 634 to cause the processor 634 to initiate formation of a semiconductor device in accordance with at least a portion of the method 300 of FIG. 3 and/or the method 400 of FIG. 4, or any combination thereof. For example, the computer executable instructions may be executable to cause the processor 634 to initiate or control formation of the SRAM array 100 of FIG. 1A or the SRAM array 200 of FIG. 2A.

As an illustrative example, the processor 634 may initiate or control forming multiple first source lines of a first metal layer of a static random-access memory (SRAM) array. Each of the multiple first source lines may span multiple columns of cells associated with the SRAM array. The processor 634 may further initiate or control forming a set of vias coupled to the multiple first source lines. A first via of the set of vias may be coupled to a first source line of the multiple first source lines and multiple the vias of the set of vias may be coupled to a second source line of the multiple first source liens. Two vias of the multiple vias that are closest to the first via may each be substantially the same distance from the first via.

The die 636 may be provided to a packaging process 638 where the die 636 is incorporated into a representative package 640. For example, the package 640 may include the single die 636 or multiple dies, such as a system-in-package (SiP) arrangement. For example, the package 640 may include or correspond to the system in package or system-on-chip device 522 of FIG. 5. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device including the SRAM array 100, the SRAM array 200, an SRAM array formed according to the method 300 of FIG. 3 and/or the method 400 of FIG. 4, or a combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces (e.g., metal lines) and vias (e.g., via structures), where the packaged semiconductor device corresponds to the package 640 including the SRAM array 100, the SRAM array 200, an SRAM array formed according to the method 300 of FIG. 3 and/or the method 400 of FIG. 4, or a combination thereof. In other implementations, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. For example, the first representative electronic device 662, the second representative electronic device 664, or both, may include the device 500 of FIG. 5. As an illustrative, non-limiting example, the first representative electronic device 662, the second representative electronic device 664, or both, may include a communications device, a fixed location data unit, a mobile location data unit, a mobile phone, a cellular phone, a satellite phone, a computer, a tablet, a portable computer, or a desktop computer, into which the SRAM array 100, the SRAM array 200, an SRAM array formed according to the method 300 of FIG. 3 and/or the method 400 of FIG. 4, or a combination thereof, is integrated.

Alternatively or additionally, the first representative electronic device 662, the second representative electronic device 664, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that includes a processor or that stores or retrieves data or computer instructions, or a combination thereof, into which the SRAM array 100, the SRAM array 200, an SRAM array formed according to the method 300 of FIG. 3 and/or the method 400 of FIG. 4, or a combination thereof, is integrated. As another illustrative, non-limiting example, one or more of the electronic devices 662 and 664 may include remote units, such as mobile phones, hand-held personal communication systems (PCS) units, portable data units such as personal data assistants, global positioning system (GPS) enabled devices, navigation devices, fixed location data units such as meter reading equipment, any other device that includes a processor or that stores or retrieves data or computer instructions, or any combination thereof. Although FIG. 6 illustrates remote units according to teachings of the disclosure, the disclosure is not limited to these illustrated units. Aspects of the disclosure may be suitably employed in any device which includes active integrated circuitry including memory and on-chip circuitry.

A device that includes the SRAM array 100, the SRAM array 200, an SRAM array formed according to the method 300 of FIG. 3 and/or the method 400 of FIG. 4, or a combination thereof, may be fabricated, processed, and incorporated into an electronic device, as described in the illustrative process 600. One or more aspects disclosed with respect to FIGS. 1-6 may be included at various processing stages, such as within the library file 612, the GDSII file 626 (e.g., a file having a GDSII format), and the GERBER file 652 (e.g., a file having a GERBER format), as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical aspects such as the mask 632, the die 636, the package 640, the PCA 658, other products such as prototype circuits or devices (not shown), or any combination thereof. Although various representative stages of production from a physical device design to a final product are depicted, in other implementations fewer stages may be used or additional stages may be included. Similarly, the process 600 may be performed by a single entity or by one or more entities performing various stages of the process 600.

Although one or more of FIGS. 1-6 may illustrate systems, apparatuses, and/or methods according to the teachings of the disclosure, the disclosure is not limited to these illustrated systems, apparatuses, and/or methods. One or more functions or components of any of FIGS. 1-6 as illustrated or described herein may be combined with one or more other portions of another of FIGS. 1-6. Accordingly, no single aspect or single example described herein should be construed as limiting and aspects and/or examples of the disclosure may be suitably combined without departing from the teachings of the disclosure.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. For example, a storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A static random-access memory (SRAM) array comprising:
    a first metal layer including multiple first source lines spanning multiple columns of cells, the multiple first source lines including a first source line and a second source line;

a second metal layer including multiple second source lines spanning multiple rows of cells; and a set of vias coupled to the multiple first source lines and to the multiple second source lines, wherein a first via of the set of vias is coupled to the first source line, wherein multiple vias of the set of vias are coupled to the second source line, and wherein two vias of the multiple vias that are closest to the first via are each substantially the same distance from the first via.

2. The SRAM array of claim 1, wherein the two vias include a second via coupled to the second source line at a first location and a third via coupled to the second source line at a second location, and wherein at least a portion of the second source line between the first location and the second location spans at least two cells.

3. The SRAM array of claim 2, wherein the portion of the second source line spans at least four cells.

4. The SRAM array of claim 1, wherein the first metal layer, the second metal layer, and the set of vias is manufactured using a 10 nanometers (nm) process.

5. The SRAM array of claim 1, wherein the second metal layer is positioned above the first metal layer, and wherein the multiple second source lines are arranged in a linear pattern.

6. The SRAM array of claim 1, wherein the multiple first source lines are orthogonal to the multiple second source lines.

7. The SRAM array of claim 1, wherein each of the multiple first source lines and each of the multiple second source lines is a ground line.

8. The SRAM array of claim 1, wherein the first metal layer includes multiple rows of wordline pads, and wherein the multiple rows of wordline pads are parallel to the multiple first source lines.

9. The SRAM array of claim 1, wherein the second metal layer includes multiple wordlines, and wherein the multiple wordlines are parallel to the multiple second source lines.

10. A method of forming a static random-access memory (SRAM) array, the method comprising:
forming multiple first source lines of a first metal layer of a static random-access memory (SRAM) array, each of the multiple first source lines spanning multiple columns of cells associated with the SRAM array; and
forming a set of vias coupled to the multiple first source lines, wherein a first via of the set of vias is coupled to a first source line of the multiple first source lines, wherein multiple vias of the set of vias are coupled to a second source line of the multiple first source lines, and wherein two vias of the multiple vias that are closest to the first via are each substantially the same distance from the first via.

11. The method of claim 10, wherein forming the multiple first source lines comprises patterning the first metal layer using a self-aligned double patterning (SADP) process, wherein forming the set of vias comprises patterning a plurality of vias using a lithography process, the lithography process using less than four masks, and wherein the plurality of vias includes the set of vias.

12. The method of claim 10, further comprising forming multiple second source lines of a second metal layer of the SRAM array, each of the multiple second source lines spanning multiple rows of cells associated with the SRAM array, wherein the set of vias couple the multiple first source lines and the multiple second source lines.

13. The method of claim 12, wherein forming the multiple second source lines comprises patterning the second metal layer using a self-aligned double patterning (SADP) process.

14. The method of claim 12, wherein the set of vias is formed using a first mask, and wherein each cell of the SRAM array includes two corresponding source lines of the multiple first source lines.

15. The method of claim 14, further comprising:
forming multiple wordline pads of the first metal layer;
forming multiple wordlines of the second metal layer, each of the multiple wordlines spanning the multiple rows of cells;
forming a second set of vias using a second mask, wherein the second set of vias are coupled to the multiple wordlines and to a first set of the multiple wordline pads; and
forming a third set of vias using a third mask, wherein the second set of vias are coupled to the multiple wordlines and to a first set of the multiple wordline pads.

16. The method of claim 15, wherein the multiple wordlines include a first wordline and a second wordline, and wherein a third source line of the multiple second source lines is positioned between the first wordline and the second wordline.

17. An apparatus comprising:
first means for coupling a first source line of a first metal layer of a static random-access (SRAM) array to a second source line of a second metal layer of the SRAM array, the first metal layer including multiple lines spanning multiple columns of cells and the second metal layer including multiple lines spanning multiple rows of cells;
second means for coupling the first source line to a third source line of the second metal layer; and
third means for coupling a fourth source line of the first metal layer to a fifth source line of the second metal layer, the fifth source line positioned between the second source line and the third source line, and wherein the first means for coupling and the second means for coupling are substantially the same distance from the third means for coupling.

18. The apparatus of claim 17, wherein each of the first means for coupling and the second means for coupling correspond to the same row of cells of the SRAM array, and wherein the first means for coupling and the second means for coupling are separated by a distance greater than or equal to two cells of the SRAM array.

19. The apparatus of claim 18, wherein the distance is greater than or equal to four cells of the SRAM array.

20. The apparatus of claim 17, wherein the first source line corresponds to a first row of cells of the SRAM array, wherein the fourth source line corresponds to a second row of cells of the SRAM array, and wherein the first row of cells is adjacent to the second row of cells.

* * * * *